(12) United States Patent
Thomson et al.

(10) Patent No.: US 6,459,310 B1
(45) Date of Patent: Oct. 1, 2002

(54) DIVIDE BY 15 CLOCK CIRCUIT

(75) Inventors: Sandy A. Thomson; Paul A. MacDonald, both of Ottawa (CA)

(73) Assignee: Nortel Networks Limited, Ottawa (CA)

( * ) Notice: Subject to any disclaimer, the term of this patent is extended or adjusted under 35 U.S.C. 154(b) by 0 days.

(21) Appl. No.: 09/899,190

(22) Filed: Jul. 6, 2001

(51) Int. Cl.[7] ............................. G06M 3/00; H04L 7/00
(52) U.S. Cl. ...................................... 327/115; 377/107
(58) Field of Search ................................ 327/175, 172, 327/165, 166, 218, 199; 377/107, 26, 64, 78

(56) References Cited

U.S. PATENT DOCUMENTS 5,101,419 A * 3/1992 Lowe et al. ............... 377/107
6,061,417 A * 5/2000 Kelem ....................... 377/26

* cited by examiner

Primary Examiner—Dinh T. Le

(57) ABSTRACT

A clock divider circuit for generating an output clock signal derived from an input clock signal with the output clock signal having a selected frequency and duty cycle. The clock divider circuit comprises a linear shift register with a feedback loop. Data is shifted through the stages of the linear shift register in response to the input clock signal being applied at a clock input port. The output clock signal is derived from the data outputs on selected stages in the linear shift register. In one aspect, the clock divider circuit divides a 667 MHz input clock signal to generate a 44 MHz output clock signal having a 50% duty cycle. In another aspect, the clock divider circuit divides a 669 MHz input clock signal to generate a 45 MHz output clock signal.

22 Claims, 3 Drawing Sheets

DIVIDE BY 15 CLOCK CIRCUIT

FIELD OF THE INVENTION

The present invention relates to digital logic circuits, and more particularly to a divide by 15 clock circuit.

BACKGROUND OF THE INVENTION

Phase Locked Loops (PLL) are commonly used in digital communication systems, such as telecommunications networks. To provide reliable locking to clocked digital (asynchronous signals), the phase locked loop requires an accurate reference input clock. Known telecommunication systems typically include a clock operating at 667 Mhz.

It would be advantageous to utilize the existing clock, for example in a telecommunication network, to generate an appropriate reference input clock for the phase locked loop. There are different ways of generating a reference input clock for the phase locked loop. One approach would involve dividing the 667 MHz clock by say 30 to produce a reference input clock of 22 Mhz. Another approach would involve dividing the 667 MHz clock to produce a reference input clock of 44 Mhz. This effectively involves dividing the 667 MHz clock by 15 using a divider circuit. Divide-by-N counters are used in applications where the number N of counts cannot be expressed in binary form, i.e. count to a base N which is not a power of 2, for example, count to the base 10 according to the decimal system. A divide-by-15 circuit may be implemented as a divide-by-3 counter circuit followed by a divide-by-5 circuit. This approach has the advantage that the divide-by-5 circuit may be operated at a lower speed.

The first approach described above would likely suffer from jitter for the higher speed reference input clock for the phase locked loop. The second approach while providing a divide-by-15 function suffers drawbacks. First, it is necessary to balance to more than one clock tree. Secondly, it is more difficult to retire the signal outside of the device with the divide-by-3 and the divide-by-5 counter circuits. Thirdly, this approach is not desirable in terms of "design for testability" or DFT because there would be flip flops in the device clocked by two separate clocks. Lastly, typical implementations result in numerous additional logic gates to the flip flop devices.

Accordingly, there remains a need for a divide-by-15 circuit which overcomes these shortcomings while preferably minimizing the number of logic gates between the flip flop devices in order to meet the timing requirements of digital circuits operating at frequencies in the 0.5 GigaHertz range.

BRIEF SUMMARY OF THE INVENTION

The present invention provides a divider circuit which generates an output signal with a 50% duty cycle and which is suitable as a reference signal for a phase locked loop circuit in digital communication networks.

The divider circuit is suitable for implementation as part of an ASIC device.

In a first aspect, the present invention provides a clock divider circuit having (a) an input port for receiving an input clock; (b) a linear shift register having a plurality of stages, each of the stages comprising a flip flop device and having a data input port, a data output port, and a clock input port, the clock input ports are coupled to the input port, and the stages are connected in series with the data output port of the previous stage coupled to the data input port of the subsequent stage; (c) a feedback loop couples the data output port of the last stage to the data input port of the first stage, and the feedback loop includes a logic gate having an output connected to the data input port of the first stage and a first input connected to the data output port of the last stage and a second input connected to the data output port of the second last stage in the linear shift register; (d) the stages in the linear shift register are operable to shift data at the data input ports to the data output ports and in the feedback loop in response to the input clock; (e) an output port for outputting an output clock signal derived from the data output of the linear shift register.

In another aspect, the present invention provides a clock divider circuit having (a) an input port for receiving an input clock; (b) a linear shift register having a plurality of stages, each of the stages has a data input port, a data output port, and a clock input port, the clock input ports are coupled to the input port, and the stages are connected in series with the data output port of the previous stage coupled to the data input port of the subsequent stage; (c) a feedback loop couples the data output port of the last stage to the data input port of the first stage, and the feedback loop includes a logic gate having an output connected to the data input port of the first stage and a first input connected to the data output port of the last stage and a second input connected to the data output port of the second last stage in the linear shift register; (d) the stages in the linear shift register are operable to shift data at the data input ports to the data output ports and in the feedback loop in response to the input clock; (e) an output port for outputting an output clock signal derived from the data output of the linear shift register; (f) a scan test mode control port; (g) a scan data input port for receiving scan test input data; (h) a scan data output port for outputting scan test output data from the linear shift register; (i) some of the stages including a scan test mode control input, and a scan test data input, the scan test mode control inputs are connected to the scan test mode control port, and at least one of the scan test data inputs are connected to the scan data input port, and the stages are operable to produce scan test output data in response to a scan test mode signal applied to the scan test mode control port.

In a further aspect, the present invention provides clock divider implemented as a circuit on an ASIC device, the clock divider circuit comprises: (a) an input port for receiving an input clock; (b) a linear shift register having a plurality of stages, each of the stages has a data input port, a data output port, and a clock input port, the clock input ports are coupled to the input port, and the stages are connected in series with the data output port of the previous stage coupled to the data input port of the subsequent stage; (c) a feedback loop couples the data output port of the last stage to the data input port of the first stage, and the feedback loop includes a logic gate having an output connected to the data input port of the first stage and a first input connected to the data output port of the last stage and a second input connected to the data output port of the second last stage in the linear shift register; (d) the stages in the linear shift register are operable to shift data at the data input ports to the data output ports and in the feedback loop in response to the input clock; (e) an output port for outputting an output clock signal derived from the data output of the linear shift register; (f) a scan test mode control port; (g) a scan data input port for receiving scan test input data; (h) a scan data output port for outputting scan test output data from the linear shift register; (i) some of the stages including a scan test mode control input, and a scan test data input, the scan test mode control inputs being connected to the scan test mode control port, and at least one of the scan test data inputs being connected to the scan data input port, and the stages being operable to produce scan test output data in response to a scan test mode signal being applied to said scan test mode control port.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made to the accompanying drawings, which show, by way of example, a preferred embodiment of the present invention, and in which.

DETAILED DESCRIPTION OF THE PREFERRED EMBODIMENT

Figure 1:
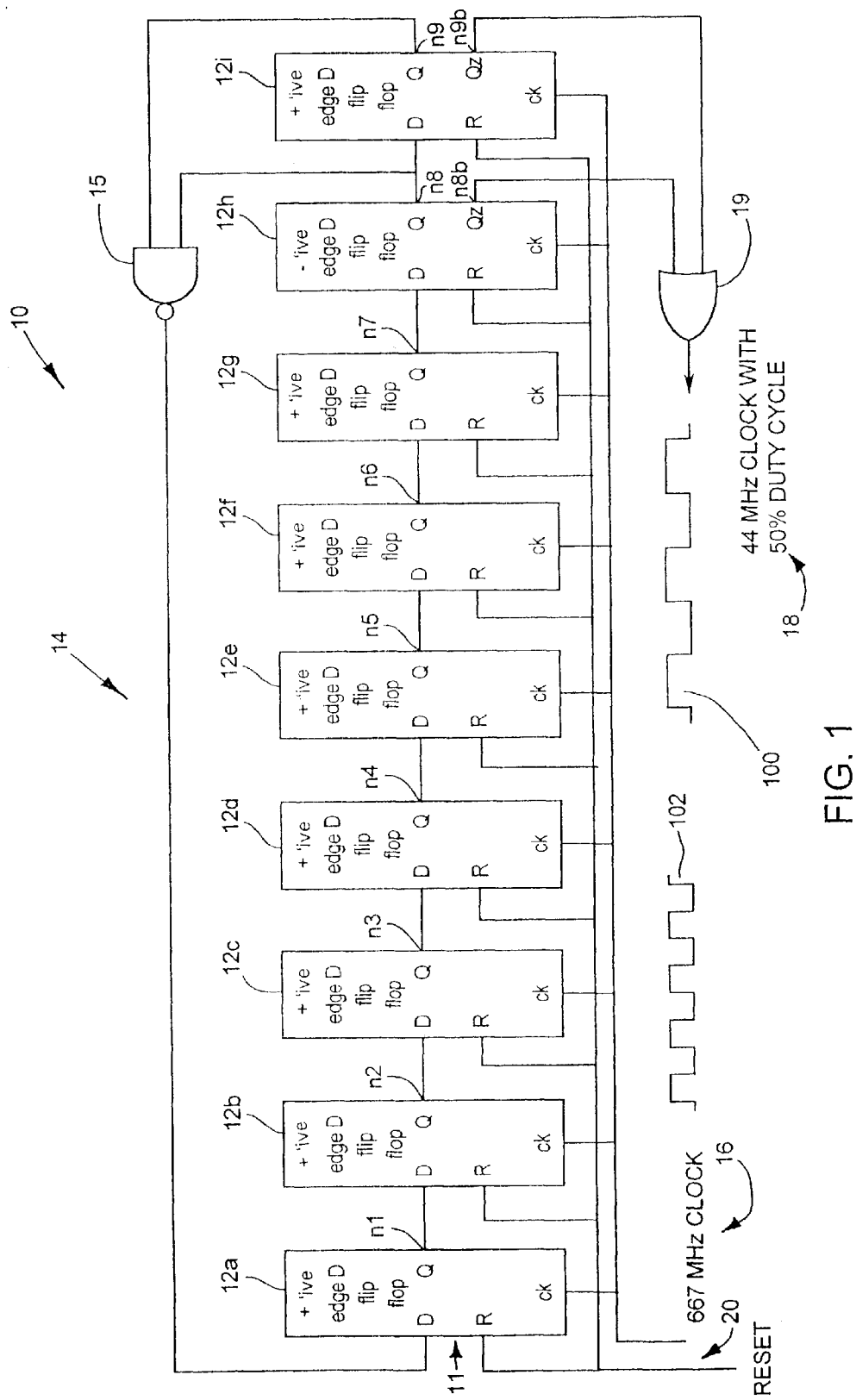
FIG. 1 is a block diagram of a divide-by-15 clock circuit according to the present invention.

Reference is first made to FIG. 1 which shows in schematic form a divide-by-15 clock or counter circuit according to the present invention and indicated generally by reference 10. As will be described, in one embodiment the divide-by-15 clock circuit 10 takes as an input a 667 MHz clock signal and produces a 44 MHz clock output signal with a 50% duty cycle. The 44 MHz output signal with 50% duty cycle is suitable as a reference signal for a Phase Locked Loop or PLL in a telecommunication network application for example.

As shown in FIG. 1, the divide-by-15 clock circuit 10 comprises a linear shift register 11, a feedback loop 14, an input port 16, and an output port 18. The linear shift register 11 comprises a series of nine flip flops 12. In FIG. 1, the flip flops 12 are indicated individually as 12*a*, 12*b*, 12*c*, 12*d*, 12*e*, 12*f*, 12*g*, 12*h* and 12*i*. As shown, the feedback loop 14 includes a logic NAND gate 15, and the output port 18 comprises a logic OR gate 19. The divide-by-15 clock circuit 10 preferably also includes a reset input indicated by reference 20.

As shown in FIG. 1, the second last or eighth flip flop 12*h* is a negative edge triggered D-type flip flop. The other flip flops 12*a* to 12*g* and 12*i* comprise positive edge triggered D-type flip flops. The negative edge triggered flip flop 12*h* is included to generate the 50% duty cycle for the output clock signal 100.

Referring to FIG. 1, the output (reference Q) from the first flip flop 12*a* is connected to the input (reference D) of the second flip flop 12*b*. Similarly, the output Q of the second flip flop 12*b* is connected to the input D of the third flip flop 12*c*, and so on for the remaining flip flops 12*d* to 12*i*. The first input of the NAND gate 15 in the feedback loop 14 is coupled to the output (indicated by reference n9) of the ninth flip flop 12*i* and the second input of the NAND gate 15 is coupled to the output (indicated by reference n8) of the eighth flip flop 12*h*. The output from the NAND gate 15 is coupled to the input D of the first flip flop 12*a*. The first input of the logic OR gate 19 is connected to the inverted output (indicated by reference n8b) of the eighth flip flop 12*h* and the second input of the logic OR gate 19 is connected to the inverted output (indicated by reference n9b) of the ninth or last flip flop 12*i*. The output of the logic OR gate 19 provides an output reference clock signal 100. As will be described in more detail below, for an input clock signal of 667 MHz as indicated by reference 102 on the clock input line 16. The clock input line 16 is connected to the clock input (reference ck) of the each one of the flip flops 12. Similarly, the reset input line 20 is coupled to the reset input (reference R) on each one of the flip flops 12 to provide a global or device reset for the divide-by-15 circuit 15. The reset input 20 ensures that the divide-by-15 circuit 10 powers up in the correct state.

Figure 2:
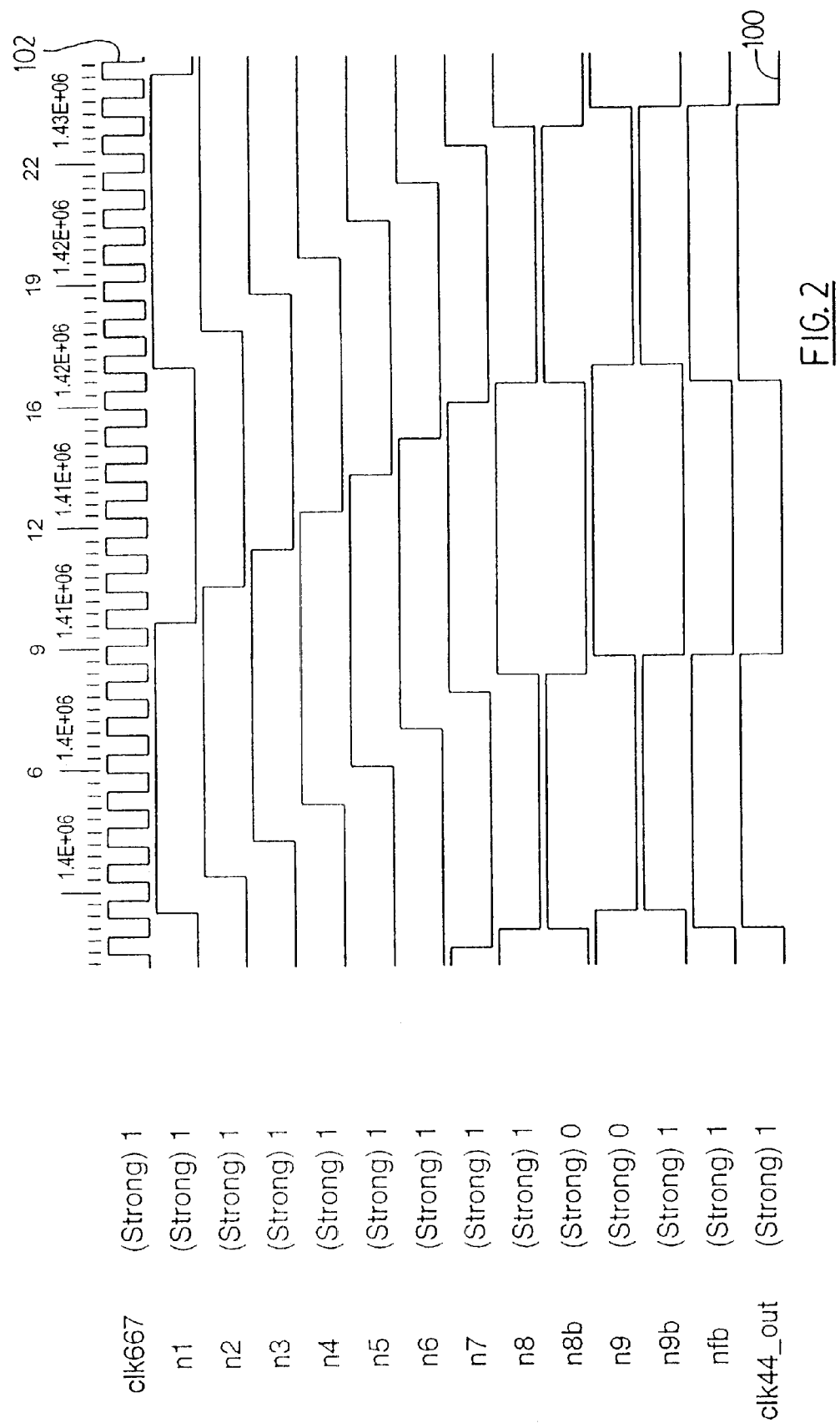
FIG. 2 is a timing diagram showing exemplary timing signals for the divide-by-15 clock circuit of FIG. 1.

Reference is next made to FIG. 2, which shows the timing relationship between the input clock signal 102 and the output reference clock signal 100, and the intermediate clocking signals generated by the individual flip flops 12. The output of the first flip flop 12*a* is depicted as signal n1. The output of the second flip flop 12*b* is depicted as signal n2. The outputs of the flip flop 12*c* to 12*i* are depicted as signals n3, n4, n5, n6, n7, n8, and n9, respectively. The inverted output of the second to last or eighth flip flop 12*h* is depicted as signal n8b, and the inverted output of the last flip flop 12*i* is depicted as signal n9b.

The tightest timing path in the divide-by-15 circuit 10 is the output Q from the negative edge triggered flip flop 12*h* to the logic NAND gate 15 and through to the input D on the first flip flop 12*a*.

The divide-by-15 clock circuit 10 as described above according to the present invention provides a design which is suitable for implementation as an ASIC device. The circuit 10 utilizes a linear feedback shift register 11 and reduces the number of logic gates between the flip flop devices. Advantageously, the design allows standard CMOS library flip flop devices to be utilized in the ASIC implementation.

Figure 3:
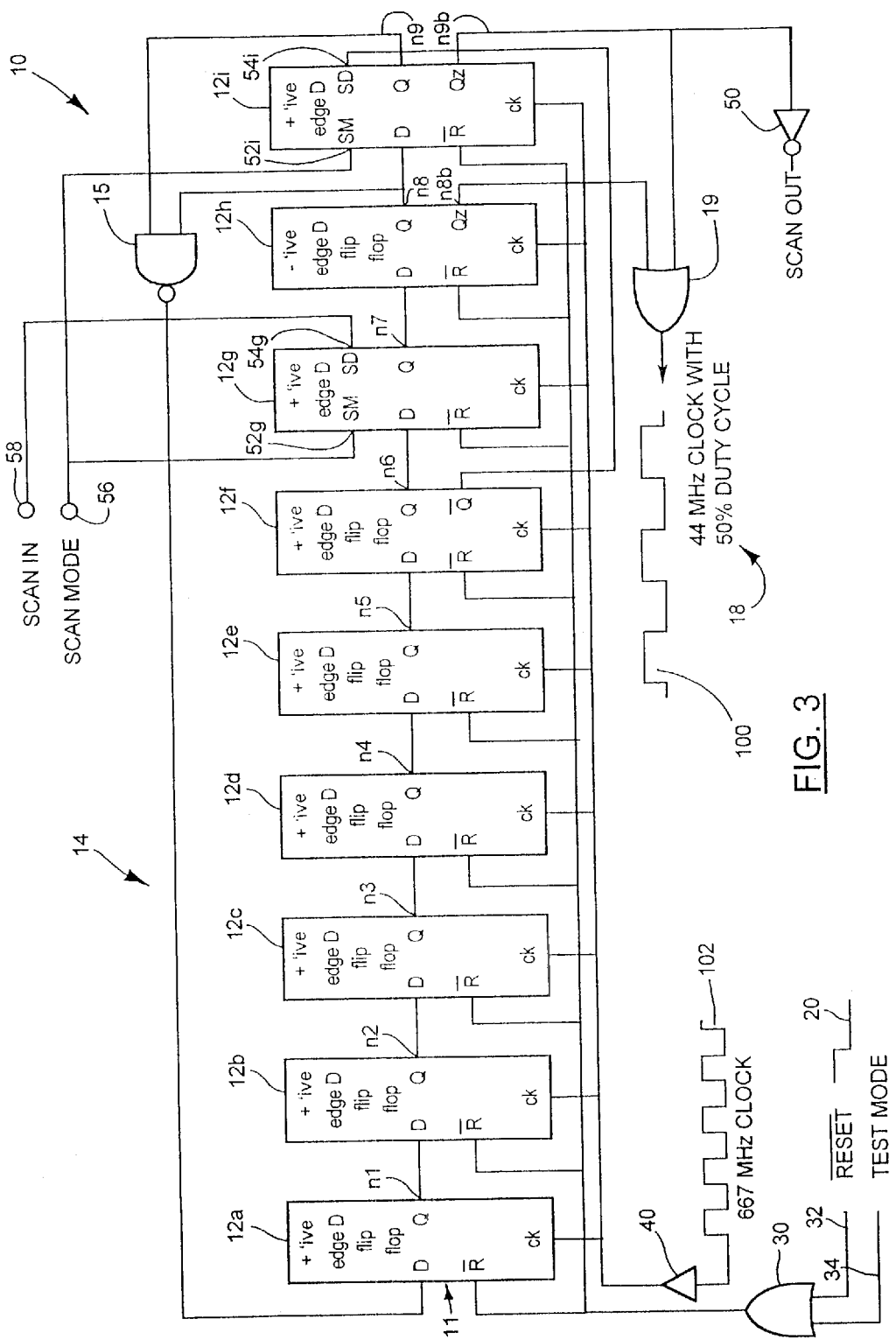
FIG. 3 is a block diagram of a divide-by-15 clock circuit for an ASIC implementation according to another aspect of the present invention.

Reference is made to FIG. 3, which shows the divide-by-15 circuit 10 for an ASIC implementation. The divide-by-15 circuit 10 includes additional circuitry for providing scan based testing for the ASIC implementation. As shown in FIG. 3, the divide-by-15 clock circuit 10 further includes a logic OR gate 30, a clock tree buffer 40, and a scan-output inverter 50.

The OR gate 30 is connected to the reset inputs R (active low) of the flip flops 12 in the linear feedback shift register 11. One input 32 of the OR gate 30 is for the reset input 20 which in this configuration is active low. The other input 34 is for a test mode signal. The test mode signal applied to the OR gate 30 puts the divide-by-15 circuit 10 into a state for scan based testing.

The clock tree buffer 40 buffers the input clock signal 102 (i.e. 667 MHz clock) in order to balance the input clock signal 102 with a very tight skew to each of the flip flops 12.

As also shown in FIG. 3, the seventh flip flop 12*g* includes a SM input 52*g* and a SD input port 54*g*. Similarly the ninth flip flop 12*i* includes a SM input 52*i* and a SD input port 54*i*. The SM inputs 52*g* and 52*i* are connected at an input terminal 56. The SD input port 54*g* is connected to an input terminal 58 which provides the input for $Scan_{13}$ In data. The SD input port 54*i* on the last flip flop 12*i* is connected to the inverted Q output of the sixth flip flop 12*f*. The seventh 12*g* and the ninth 12*i* flip flops are put into scan mode when a $Scan_{13}$ Mode signal is applied to the input terminal 56. When an active high $Scan_{13}$ Mode signal is applied to the SM inputs 52, data at the at the input terminal 58 is clocked into the seventh flip flop 12*g*, and the inverted Q output of the sixth flip flop 12*f* provides the data input on the SD input port 54*i* for the last flip flop 12*i*. The scan-out inverter 50 is connected to the inverted Q output of the last flip flop 12*i* and provides a buffered and inverted Scan$_{13}$ Out output.

As described above, the divide-by-15 clock circuit 10 includes a linear feedback shift register 11 having nine flip flop devices 12 with the second last flip flop device 12*h* comprising a negative edge triggered device. The configuration for the linear feedback shift register 11 can be generalized for a divide-by-N clock circuit where R is an odd number. The number of flip flop devices 12 in the linear feedback shift register 11 is given by N÷2+2. For example, a divide-by-25 counter will have a linear feedback shift register with thirteen flip flop devices, and for an output clock signal with a 50% duty cycle the 12$^{th}$ flip flop would comprise a negative edge triggered device.

In another implementation, the input clock comprises a clock signal 102 operating at 669 MHz, and the resultant output clock signal 100 is 45 MHz.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A clock divider circuit comprising:
   (a) an input port for receiving an input clock;
   (b) a linear shift register having a plurality of stages including a first-stage and a last stage, each of said stages comprising a flip flop device having a data input port, a data output port, and a clock input port, said clock input ports being coupled to said input port, and said stages being connected in series with the data output port of said previous stage being coupled to the data input port of the subsequent stage, at least one of said flip flops being negative-edge triggered and at least one of said flip flops being positive-edge triggered;
   (c) a feedback loop coupling the data output port of said last stage to the data input port of said first stage, and said feedback loop including a logic gate having an output connected to the data input port of said first stage and a first input connected to the data output port of said last stage and a second input connected to the data output port of said second last stage in said linear shift register;
   (d) said stages in said linear shift register being operable to shift data at said data input ports to said data output ports and in said feedback loop in response to said input clock;
   (e) an output port coupled to said last stage and said second last stage for receiving data and outputting an output clock signal.

2. The clock divider circuit as claimed in claim 1, wherein said last stage and said second last stage further include an inverted data output port and said output port comprises a logical OR gate having a first input connected to the inverted data output port of said last stage and a second input connected to the inverted data output port of said second last stage in said linear shift register.

3. The clock divider circuit as claimed in claim 2, wherein said logic gate in said feedback loop comprises a NAND gate, and wherein said data inputs for said logical OR gate are logically inverted.

4. The clock divider circuit as claimed in claim 3, further including a reset input port, and wherein each of said stages in said linear shift register include a reset input, said reset inputs being coupled to said reset input port and said stages being responsive to a reset signal applied to said reset input port.

5. The clock divider circuit as claimed in claim 4, wherein said input clock comprises a 667 MHz clock signal, and said linear shift register comprises nine stages to generate the output clock signal at 44 MHz and having a duty cycle of 50%.

6. The clock divider circuit as claimed in claim 5, wherein said circuit is implemented as part of an ASIC device.

7. The clock divider circuit as claimed in claim 4, wherein said input clock comprises a 669 MHz clock signal, and said linear shift register means comprises nine stages to generate the output clock signal at 45 MHz.

8. A clock divider implemented as a circuit on an ASIC device, said clock divider circuit comprising:
   (a) an input port for receiving an input clock;
   (b) a linear shift register having a plurality of stages including a first stage and a last stage, each of said stages having a data input port, a data output port, and a clock input port, said clock input ports being coupled to said input port, and said stages being connected in series with the data output port of said previous stage being coupled to the data input port of the subsequent stage;
   (c) a feedback loop coupling the data output port of said last stage to the data input port of said first stage, and sail feedback loop including a logic gate having an output connected to the data input port of said first stage and a first input connected to the data output port of said last stage and a second input connected to the data output port of said second last stage in said linear shift register;
   (d) said stages in said linear shift register being operable to shift data at said data input ports to said data output ports and in said feedback loop in response to said input clock;
   (e) an output port coupled to said last stage and said second last stage for receiving data and outputting an output clock signal;
   (f) a scan test mode control port;
   (g) a scan data input port for receiving scan test input data;
   (h) a scan data output port for outputting scan test output data from said linear shift register;
   (i) some of said stages including a scan test mode control input, and a scan test data input, said scan test mode control inputs being connected to said scan test mode control port, and at least one of said scan test data inputs being connected to said scan data input port, and said stages being operable to produce scan test output data in response to a scan test mode signal being applied to said scan test mode control port.

9. The clock divider circuit as claimed in claim 1, wherein each of said flip flops is positive-edge triggered except the flip flops of said second last stage.

10. The clock divider circuit as claimed in claim 8, further including a control input port for selecting between test mode and reset, said control input port comprising a logic gate having a first input for receiving, a test mode signal, and a second input for receiving a reset signal.

11. The clock divider circuit as claimed in claim 1, wherein said last stage and said second last stage further include an inverted data output port and said output port comprises a logical OR gate having a first input connected to the inverted data output port of said last stage and a second input connected to the inverted data output port of said second last stage in said linear shift register.

12. The clock divider circuit as claimed in claim 11, wherein said logic gate in said feedback loop comprises a NAND gate, and wherein said data inputs for said logical OR gate are logically inverted.

13. The clock divider circuit as claimed in claim 12, further including a reset input port, and wherein each of said stages in said linear shift register include a reset input, said reset inputs being coupled to said reset input port and said stages being responsive to a reset signal applied to said reset input port.

14. The clock divider circuit as claimed in claim 13, wherein said input clock comprises a 667 MHz clock signal, and said linear shift register comprises nine stages to generate the output clock signal at 44 MHz and having a duty cycle of 50%.

15. A clock divider circuit comprising:
(a) an input port for receiving an input clock;
(b) a linear shift register means having a plurality of stages including a first stage and a last stage, each of said stages having a data input port, a data output port, and a clock input port, said clock input ports being coupled to said input port, and said stages being connected in series with the data output port of said previous stage being coupled to the data input port of the subsequent stage, at least one of said flip flops being negative-edge triggered and at least one of said flip flops being positive-edge triggered;
(c) feedback loop means for coupling the data output port of said last stage to the data input port of said first stage, and said feedback loop means including a logic gate having an output connected to the data input port of said first stage and a first input connected to the data output port of said last stage and a second input connected to the data output port of said second last stage in said linear shift register means;
(d) said stages in said linear shift register means being operable to shift data at said data input ports to said data output ports and in said feedback loop means in response to said input clock;
(e) an output port coupled to said last stage and said second last stage for receiving data and outputting an output clock signal.

16. The clock divider circuit as claimed in claim 1, wherein said last stage and said second last stage further include an inverted data output port and said output port comprises a logical OR gate having a first input connected to the inverted data output port of said last stage and a second input connected to the inverted data output port of said second last stage in said linear shift register means.

17. The clock divider circuit as claimed in claim 16, wherein said logic gate in said feedback loop means comprises a NAND gate, and wherein said data inputs for said logical OR gate are logically inverted.

18. The clock divider circuit as claimed in claim 17, further including a reset input port, and wherein each of said stages in said linear shift register means include a reset input, said reset inputs being coupled to said reset input port and said stages being responsive to a reset signal applied to said reset input port.

19. The clock divider circuit as claimed in claim 18, wherein said input clock comprises a 667 MHz clock signal, and said linear shift register means comprises nine stages to generate the output clock signal at 44 MHz and having a duty cycle of 50%.

20. The clock divider circuit as claimed in claim 19, wherein said circuit is implemented as part of an ASIC device.

21. The clock divider circuit as claimed in claim 18, wherein said input clock comprises a 669 MHz clock signal, and said linear shift register means comprises nine stages to generate the output clock signal at 45 MHz.

22. The clock divider circuit as claimed in claim 14, wherein each of said flip flops is positive-edge triggered except the flip flops of said second last stage.

* * * * *